(12) United States Patent
Em

(10) Patent No.: US 8,476,937 B2
(45) Date of Patent: Jul. 2, 2013

(54) INPUT BUFFER CIRCUIT CAPABLE OF ADJUSTING VARIATION IN SKEW

(75) Inventor: Ho Seok Em, Icheon (KR)

(73) Assignee: Hynix Semiconductor Inc., Icheon (KR)

( * ) Notice: Subject to any disclaimer, the term of this patent is extended or adjusted under 35 U.S.C. 154(b) by 88 days.

(21) Appl. No.: 12/980,288

(22) Filed: Dec. 28, 2010

(65) Prior Publication Data

US 2011/0316604 A1    Dec. 29, 2011

(30) Foreign Application Priority Data

Jun. 24, 2010    (KR) .................. 10-2010-0060056

(51) Int. Cl.
*H03K 5/22*    (2006.01)
*H03K 5/153*    (2006.01)

(52) U.S. Cl.
USPC ................. 327/77; 327/78; 327/79; 327/108; 327/333

(58) Field of Classification Search
USPC .................. 327/77, 78, 79, 108, 333
See application file for complete search history.

(56) References Cited

U.S. PATENT DOCUMENTS

2010/0039142 A1*    2/2010   Lee et al. ................... 327/77

FOREIGN PATENT DOCUMENTS

| KR | 1020080061737 A | 7/2008 |
| KR | 100861373 B1 | 9/2008 |

* cited by examiner

*Primary Examiner* — John Poos

(57) ABSTRACT

An input buffer circuit for use in a semiconductor device includes a comparator configured to compare a reference voltage with a voltage of an input signal, and output the result of comparison, an activation unit configured to control an activation state of an input buffer in response to an enable signal, a skew adjusting unit configured to change an amount of a current flowing in the comparator in response to one or more skew adjusting signals, and a control signal generator configured to control the enable signal and the skew adjusting signal in response to one or more calibration codes and an input control signal.

14 Claims, 4 Drawing Sheets

INPUT BUFFER CIRCUIT CAPABLE OF ADJUSTING VARIATION IN SKEW

CROSS-REFERENCE TO RELATED APPLICATION

The priority of Korean patent application No. 10-2010-0060056 filed on Jun. 24, 2010, the disclosure of which is hereby incorporated in its entirety by reference, is claimed.

BACKGROUND OF THE INVENTION

Embodiments of the present invention relate to an input buffer circuit, and more specifically, to an input buffer circuit for controlling skew and regulating discrete voltage levels.

Generally, an input buffer transforms a signal of a transistor-transistor logic level into a signal of a complementary metal oxide semiconductor (CMOS) level.

A semiconductor memory device has been applied to a variety of systems. Internal circuits of a semiconductor integrated circuit (IC) are composed of CMOS circuits. Thus, if a level of an external input signal is changed to another level, the external input signal level must be changed to a voltage level usable for a CMOS circuit. Therefore, the semiconductor memory device includes an input buffer in each of an address input end, a data input end, a clock signal input end, and a driving signal input end.

FIG. 1 is a circuit diagram illustrating a conventional input buffer circuit.

Referring to FIG. 1, the input buffer circuit according to the related art includes a comparator 10 and an activation unit 20.

In this case, the comparator 10 compares a reference voltage (VREF) level with an input signal (IN) level, and outputs an output signal OUT according to the result of the comparison. In response to a difference in the input signal (IN) level and the reference voltage (VREF) level, a voltage level of the output signal OUT of the comparator 10 is changed.

The comparator 10 is a current-mirror-type unit amplifier, and includes a plurality of PMOS transistors P1 to P6 and a plurality of NMOS transistors N1 and N2.

Each of the PMOS transistors P1 and P2 is used as a precharge transistor controlled by an enable signal EN. The NMOS transistor N1 receives a reference voltage VREF through a gate terminal. The reference voltage VREF has a voltage level that is half of a power-supply voltage VDDQ. The NMOS transistor N2 receives an input signal IN through a gate terminal.

In addition, the activation unit 20 includes an NMOS transistor N3, which is coupled between the comparator 10 and a ground voltage terminal VSSQ so as to receive the enable signal EN through a gate terminal.

Operations of the aforementioned conventional input buffer circuit are as follows.

First, if the enable signal EN is low in level (or in a low state), the NMOS transistor N3 is turned off, and the PMOS transistors P1 and P2 are turned on, so that the output signal OUT is fixed to a high level irrespective of the input signal (IN) level.

The aforementioned enable signal EN is used to control the input buffer. If the enable signal EN is a low state, the input buffer is not operated and outputs a high level signal. If the enable signal EN is high in level, the input buffer is operated.

Accordingly, if the enable signal EN is high in level, the NMOS transistor N3 is turned on, and the PMOS transistors P1 and P2 are turned off. In this case, if the input signal IN is equal to or higher than the reference voltage VREF, the output signal OUT becomes a low state. Otherwise, if the input signal IN is lower than the reference voltage VREF, the output signal OUT becomes high in level.

As a result, the conventional input buffer changes the input signal (IN) level to a power-supply voltage (VDDQ) level.

However, the aforementioned conventional input buffer circuit is unable to properly cope with variation in characteristics of the input buffer in response to a variation in skew characteristics of transistors.

BRIEF SUMMARY OF THE INVENTION

Various embodiments of the present invention are directed to providing an input buffer circuit that substantially obviates one or more problems due to limitations and disadvantages of the related art.

First, an embodiment of the present invention relates to an input buffer circuit that compensates for variation in operation characteristics in response to a variation in skew by controlling an operation current of an input buffer using a ZQ calibration code.

Second, an embodiment of the present invention relates to an input buffer circuit that properly copes with a variation in skew of an input buffer using a ZQ calibration code configured to control the strength of an output signal of an output buffer that uses the same power source and transistor as those of the input buffer.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

In accordance with an embodiment of the present invention, an input buffer circuit includes a comparator configured to compare a reference voltage with a voltage of an input signal, and output an output signal, an activation unit configured to control an activation state of the input buffer circuit in response to an enable signal, a skew adjusting unit configured to change an amount of a current flowing in the comparator in response to one or more skew adjusting signals, and a control signal generator configured to generate the enable signal and the skew adjusting signal in response to one or more calibration codes and an input control signal.

It is to be understood that both the foregoing general description and the following detailed description of the present invention are exemplary and explanatory and are intended to provide further explanation of the invention as claimed.

DESCRIPTION OF EMBODIMENTS

Figure 1:
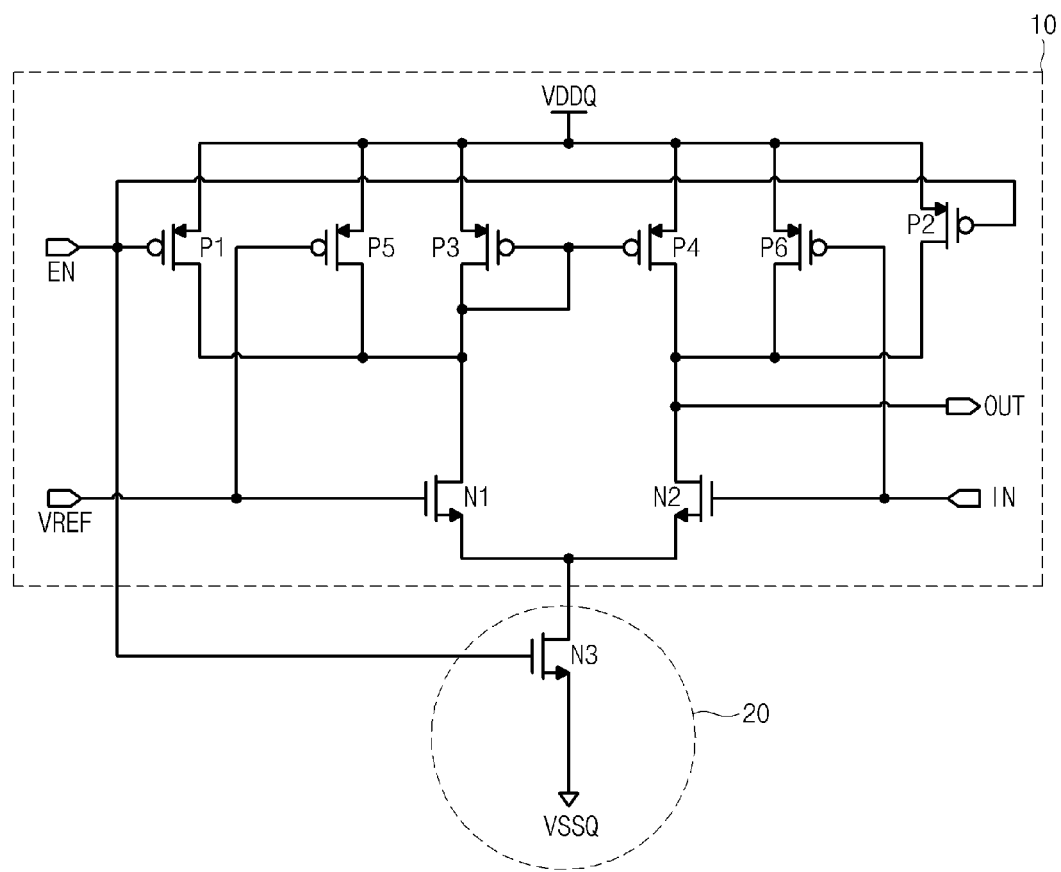
FIG. 1 is a circuit diagram illustrating a conventional input buffer.

Reference will now be made in detail to the embodiments of the present invention, examples of which are illustrated in the accompanying drawings. Wherever possible, the same reference numbers will be used throughout the drawings to refer to the same or like parts.

An input buffer circuit according to embodiments of the present invention will hereinafter be described with reference to the accompanying drawings.

Various semiconductor devices, each of which is implemented with integrated circuit (IC) chips such as a central processing unit (CPU), a memory, a gate array, and the like, are applied to a variety of electronic products such as a personal computer (PC), a server, a workstation, and the like.

In most cases, a semiconductor device includes an input circuit for receiving a variety of signals transmitted from an external part through an input pad, and an output circuit for providing an internal signal to the external part through an output pad.

As electric products are designed to be operated at higher speeds, the swing width of a signal exchanged between semiconductor devices is reduced, so that a delay time encountered in signal transmission can be minimized.

However, the less the swing width of a signal, the greater the noise influence. In addition, the degree of signal reflection caused by impedance mismatch becomes more serious in the interfacing between the semiconductor devices.

The impedance mismatch is encountered by an external noise, a variation of a power-supply voltage VDDQ, a variation in operation temperature, variation in a fabrication process, and the like. Due to the impedance mismatch, it is difficult for data to be transmitted at high speeds, and output data may be unexpectedly distorted.

Therefore, if an external device receives the distorted output data, there arise various problems, for example, a setup/hold fail or a misunderstood input level, etc. In order to solve the above problems, the memory device, high-speed operation of which is needed, includes an impedance matching circuit called an on-die termination (ODT) device in the vicinity of an internal pad of a chip.

Typically, in the on-die termination (ODT) device, a transmission apparatus performs source termination caused by an output circuit, and a reception apparatus performs parallel termination through a termination circuit that is coupled in parallel to the input circuit coupled to the input pad.

The ZQ calibration is performed in a ZQ node used as a node for calibration, and generates a pull-up calibration code and a pull-down calibration code that are changed according to PVT (process, voltage and temperature) conditions.

By means of the code generated by the ZQ calibration result, a resistance value of the ODT device is adjusted. In the case of the semiconductor memory device, a termination resistance value of a DQ pad is adjusted by the code generated by the ZQ calibration result. A detailed description of the ZQ calibration is as follows. That is, during the ZQ calibration, a calibration operation is performed using a ZQ node serving as a calibration node.

The embodiment of the present invention may be applied to input buffer circuits of all memories capable of supporting the ZQ calibration operation.

Figure 2:
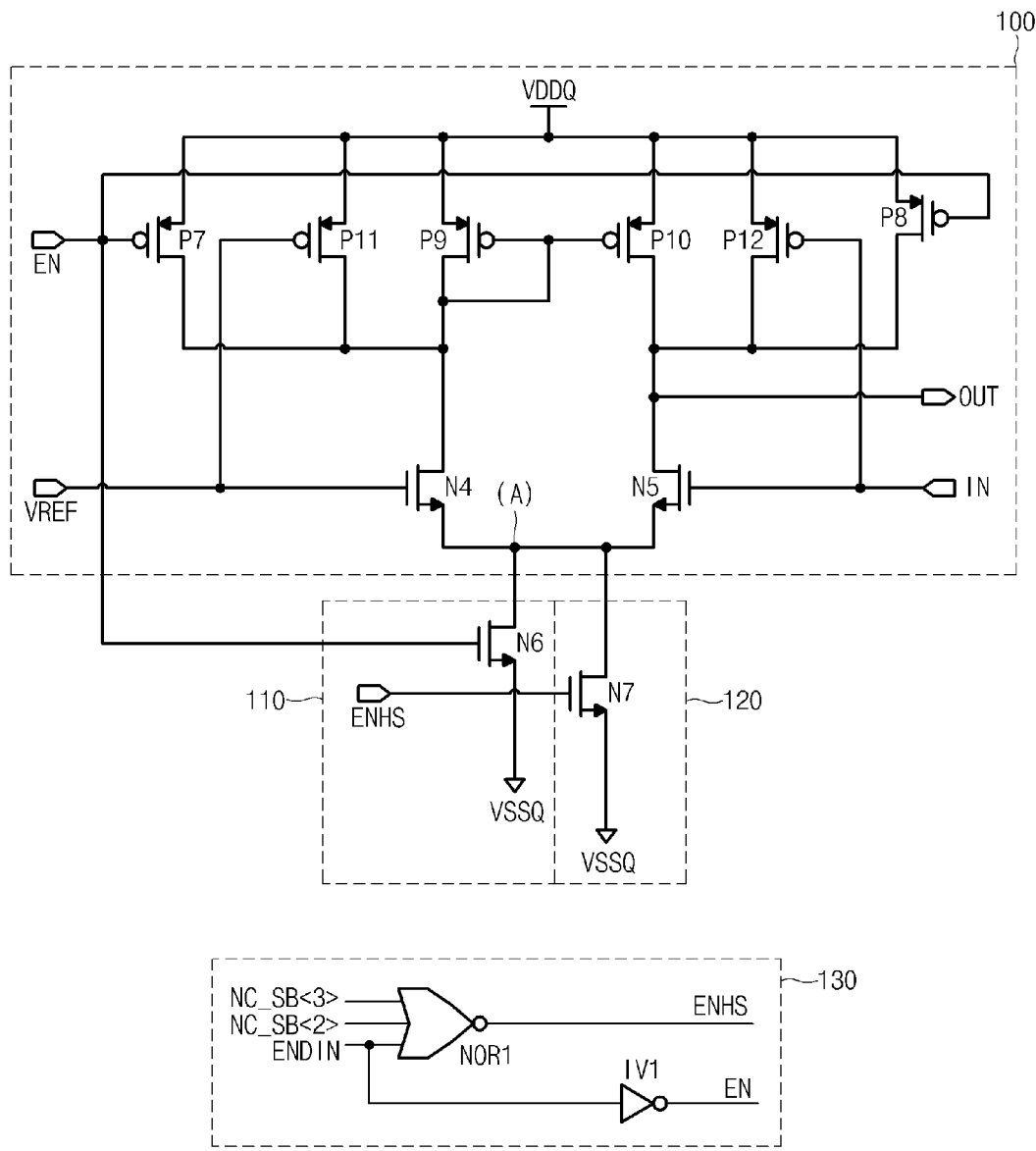
FIG. 2 is a circuit diagram illustrating an input buffer circuit according to an embodiment of the present invention.

FIG. 2 is a circuit diagram illustrating an input buffer circuit according to an embodiment of the present invention.

Referring to FIG. 2, the input buffer circuit includes a comparator 100, an activation unit 110, and a skew adjusting unit 120, and a control signal generator 130.

In this case, the comparator 100 compares a reference voltage (VREF) level with an input signal (IN) level, and outputs an output signal OUT according to the result of the comparison. In response to a difference in the input signal (IN) level and the reference voltage (VREF) level, a voltage level of the output signal OUT of the comparator 100 is changed.

The comparator 100 is a current-mirror-type unit amplifier, and includes a plurality of PMOS transistors P7 to P12 and a plurality of NMOS transistors N4 and N5.

Each of the PMOS transistors P7 and P8 is used as a precharge transistor controlled by an enable signal EN. The PMOS transistors P7 and P8 are coupled in parallel to PMOS transistors P11 and P12, respectively, and they receive the enable signal EN through a common gate terminal.

The PMOS transistors P11 and P12 are coupled in parallel to the PMOS transistors P9 and P10, respectively, and they receive the reference voltage VREF and the input signal IN through their gate terminals, respectively. In addition, the PMOS transistors P9 and P10 are coupled between a power-supply voltage (VDDQ) input terminal and the NMOS transistor N4 and N5, respectively. The gate terminals of the PMOS transistors P9 and P10 and a drain terminal of the PMOS transistor P9 are also commonly coupled.

The NMOS transistor N4 is coupled between the drain terminal of the PMOS transistor P9 and a node A, so that it receives the reference voltage VREF through a gate terminal. In this case, the reference voltage VREF has a voltage level that is half of a power-supply voltage VDDQ. The NMOS transistor N5 is coupled between a drain terminal of the PMOS transistor P10 and the node A, so that it receives the input signal IN through a gate terminal.

The activation unit 110 includes an NMOS transistor N6, that is coupled between the node A and a ground voltage terminal VSSQ so as to receive the enable signal EN through a gate terminal.

The skew adjusting unit 120 includes an NMOS transistor N7, that is coupled between the node A and the ground voltage terminal VSSQ so as to receive a skew adjusting signal ENHS through a gate terminal.

The control signal generator 130 includes a NOR gate NOR1 and an inverter IV1.

In this case, the NOR gate NOR1 performs a NOR operation between each calibration code NC_SB<3> or NC_SB<2> and an input control signal ENDIN, and thus outputs the skew adjusting signal ENHS. The inverter IV1 inverts the input control signal ENDIN so that it outputs the enable signal EN. The input control signal ENDIN is used to control an activation state of the enable signal EN.

The operations of the input buffer circuit according to the first embodiment of the present invention will hereinafter be described with reference to FIG. 2.

First, if the enable signal EN is low in level, the NMOS transistor N6 is turned off, and the PMOS transistors P7 and P8 are turned on, so that the output signal OUT is fixed to a high level irrespective of the input signal (IN) level.

The above-mentioned enable signal EN is a signal for controlling the input buffer circuit. If the enable signal EN is low in level, the input buffer circuit is not operated so that it outputs a high-level signal. If the enable signal EN is high in level, the input buffer circuit is operated. Accordingly, if the enable signal EN is high in level, the NMOS transistor N6 is turned on, and the PMOS transistors P7 and P8 are turned off.

In this case, if the input signal IN is equal to or higher than the reference voltage VREF, the output signal OUT is output as a low-level signal. If the input signal IN is lower than the reference voltage VREF, the output signal OUT is output as a high-level signal.

As a result, the input buffer circuit according to this embodiment of the present invention can change a level of the input signal IN to a discrete signal with a power-supply voltage VDDQ or a ground voltage VSSQ.

The following Table 1 shows NCODE values of the ZQ calibration.

TABLE 1

| Decimal Value | Calibration code NC_SB<3> | Calibration code NC_SB<2> | Calibration code NC_SB<1> | Calibration code NC_SB<0> |
| --- | --- | --- | --- | --- |
| 0 | L | L | L | L |
| 1 | L | L | L | H |
| 2 | L | L | H | L |
| 3 | L | L | H | H |
| 4 | L | H | L | L |
| 5 | L | H | L | H |
| 6 | L | H | H | L |
| 7 | L | H | H | H |
| 8 | H | L | L | L |
| 9 | H | L | L | H |
| 10 | H | L | H | L |
| 11 | H | L | H | H |
| 12 | H | H | L | L |
| 13 | H | H | L | H |
| 14 | H | H | H | L |
| 15 | H | H | H | H |

With reference to Table 1, the calibration code values NC_SB<3> to NC_SB<0> are set to logic low (L) or high (H)—level signals in response to individual decimal values.

The control signal generator 130 according to this embodiment of the present invention may use the above-mentioned calibration codes NC_SB<3> and NC_SB<2> shown in Table 1 so as to adjust the skew of the skew adjusting unit 120.

If a decimal value is in the range of 0~7 on the basis of a specific decimal reference value (i.e., '7'), the skew indicating the switching speed of a transistor is controlled to be in a slow (SS) state. In contrast, if a decimal value is in the range of 8~15 on the basis of a decimal value (i.e., '7'), the skew indicating the switching speed of the transistor is controlled to be in a fast (FF) state.

If the skew of the transistor is in the slow (SS) state, the operating current is increased so that the skew of the transistor is similar to those of a typical case.

Therefore, the control signal generator 130 controls the skew adjusting signal ENHS for controlling the skew adjusting unit 120 in response to the ZQ calibration codes shown in Table 1, and controls an activation state of the enable signal EN that controls the activation unit 110.

In this case, the calibration codes NC_SB<3> and NC_SB<2> may control the skew adjusting signal ENHS, and the input control signal ENDIN may control the enable signal EN.

Therefore, if each of the calibration codes NC_SB<3> and NC_SB<2> and the input control signal ENDIN is low in level, the NOR gate NOR1 controls the skew adjusting signal ENHS to be activated to a high level and also controls the enable signal EN to be high in level.

If the enable signal EN goes high in level, the activation unit 110 is operated as described above. When the skew adjusting signal ENHS goes high in level, the NMOS transistor N7 is turned on so as to provide a pull-down voltage to the comparator 100.

If the skew indicating the switching speed of the transistor is in the slow (SS) state, both the activation unit 110 and the skew adjusting unit 120 are operated, so that the operating current is increased.

If the calibration codes NC_SB<3> and NC_SB<2> are low in level, these low-level calibration codes NC_SB<3> and NC_SB<2> indicate that the strength of an output signal of the output buffer that uses the ZQ calibration code is greater than a reference value (i.e., decimal value=7).

In this case, further increasing of a current into the input buffer circuit is required, so that turn-on resistance of the transistor can be matched. That is, this indicates that the transistor skew of the output buffer is in the slow (SS) state.

On the other hand, the NOR gate NOR1 deactivates the skew adjusting signal ENHS to a low level when any one of the input signal ENDIN and the calibration codes NC_SB<3> and NC_SB<2> is high in level. In this case, the skew adjusting unit 120 is turned off so that the skew adjusting operation is not achieved.

The ZQ calibration operation does not have a timing interval coexisting with that of a normal operation. Upon completion of calibration, if a code value is latched and the same transistor is used in the ZQ calibration operation and the normal operation, skew information of the ZQ calibration operation is identical to that of the normal operation. Accordingly, the ZQ calibration code used in the output buffer can also be used as a control signal of the input buffer without any problems.

Figure 3:
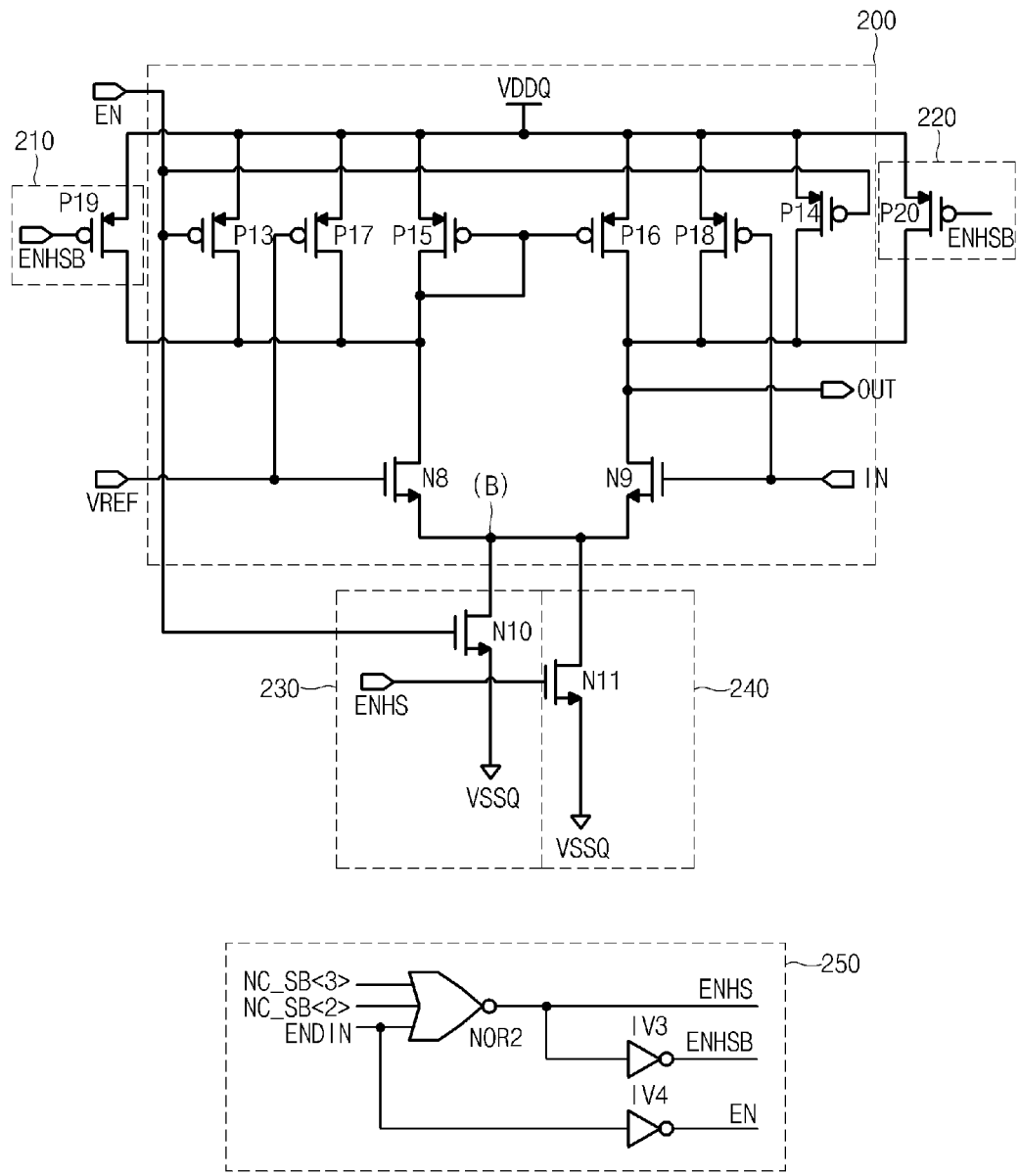
FIG. 3 is a circuit diagram illustrating an input buffer circuit according to another embodiment of the present invention.

FIG. 3 is a circuit diagram illustrating an input buffer circuit according to another embodiment of the present invention.

Referring to FIG. 3, the input buffer circuit includes a comparator 200, precharge units 210 and 220, an activation unit 230, a skew adjusting unit 240, and a control signal generator 250.

In this case, the comparator 200 compares a reference voltage (VREF) level with an input signal (IN) level, and outputs an output signal OUT according to the result of comparison. In response to a difference in the input signal (IN) level and the reference voltage (VREF) level, a voltage level of the output signal OUT of the comparator 200 is changed.

The comparator 200 is a current-mirror-type unit amplifier, and includes a plurality of PMOS transistors P13 to P18 and a plurality of NMOS transistors N8 and N9.

Each of the PMOS transistors P13 and P14 is used as a precharge transistor controlled by an enable signal EN. The PMOS transistors P13 and P14 are coupled in parallel to PMOS transistors P17 and P18, respectively, and they receive the enable signal EN through a common gate terminal.

The PMOS transistors P17 and P18 are coupled in parallel to the PMOS transistors P15 and P16, respectively, and they receive the reference voltage VREF and the input signal IN through their gate terminals, respectively. In addition, the PMOS transistors P15 and P16 are coupled between a power-supply voltage (VDDQ) input terminal and each NMOS transistor N8 or N9, respectively. The gate terminals of the PMOS transistors P17, P18 and a drain terminal of the PMOS transistor P17 are also commonly coupled.

The NMOS transistor N8 is coupled between the drain terminal of the PMOS transistor P15 and a node B, so that it receives the reference voltage VREF through a gate terminal. In this case, the reference voltage VREF has a voltage level that is half of a power-supply voltage VDDQ. The NMOS transistor N9 is coupled between a drain terminal of the PMOS transistor P16 and the node B, so that it receives the input signal IN through a gate terminal.

The precharge unit 210 includes a PMOS transistor P19 that is coupled in parallel to the PMOS transistor P13 so as to receive a skew adjusting signal ENHSB through a gate terminal. In this case, the skew adjusting signal ENHSB has a phase opposite to that of the other skew adjusting signal ENHS. In addition, the precharge unit 220 includes a PMOS transistor P20 that is coupled in parallel to the PMOS transistor P14 so as to receive the skew adjusting signal ENHSB through a gate terminal.

The activation unit 230 includes an NMOS transistor N10 that is coupled between the node B and a ground voltage terminal VSSQ so as to receive the enable signal EN through a gate terminal.

The skew adjusting unit 240 includes an NMOS transistor N11 that is coupled between the node B and the ground voltage terminal VSSQ so as to receive the skew adjusting signal ENHS through a gate terminal.

The control signal generator 250 includes a NOR gate NOR2 and inverters IV3 and IV4.

In this case, the NOR gate NOR2 performs a NOR operation between each calibration code NC_SB<3> or NC_SB<2> and an input control signal ENDIN, and thus outputs the skew adjusting signal ENHS. The inverter IV3 inverts the skew adjusting signal ENHS so that it outputs the skew adjusting signal ENHSB. The inverter IN4 inverts the input control signal ENDIN so that it outputs the enable signal EN. The input control signal ENDIN is used to control an activation state of the enable signal EN.

The operations of the input buffer circuit according to this embodiment of the present invention will hereinafter be described with reference to FIG. 3.

First, if the enable signal EN is low in level, the NMOS transistor N10 is turned off, the PMOS transistors P13 and P14 are turned on, so that the output signal OUT is fixed to a high level irrespective of the input signal (IN) level.

The above-mentioned enable signal EN is a signal for controlling the input buffer circuit. If the enable signal EN is low in level, the input buffer circuit is not operated so that it outputs a high-level signal. If the enable signal EN is high in level, the input buffer circuit is operated. Accordingly, if the enable signal EN is high in level, the NMOS transistor N10 is turned on, and the PMOS transistors P13 and P14 are turned off.

In this case, if the input signal IN is equal to or higher than the reference voltage VREF, the output signal OUT is output as a low-level signal. If the input signal IN is lower than the reference voltage VREF, the output signal OUT is output as a high-level signal.

As a result, the input buffer circuit according to this embodiment of the present invention can change a level of the input signal IN to a discrete signal with a power-supply voltage VDDQ or a ground voltage VSSQ.

The control signal generator 250 according to this embodiment of the present invention may use the calibration codes NC_SB<3> and NC_SB<2> shown in Table 1 so as to adjust the skew of the skew adjusting unit 240.

If the skew of the transistor is in the slow (SS) state, the operating current is increased in response to turn-on operations of the skew adjusting unit 240, and the precharge units 210 and 220, so that the skew of the transistor is similar to those of a typical case.

Therefore, the control signal generator 250 controls not only activation states of the skew adjusting signals ENHS and ENHSB for controlling the skew adjusting unit 240 according to the ZQ calibration codes shown in Table 1, but also an activation state of the enable signal EN for controlling the activation unit 230.

In this case, the calibration codes NC_SB<3> and NC_SB<2> may be adapted to control the skew adjusting signals ENHS and ENHSB, and the input control signal ENDIN may be adapted to control the enable signal EN.

Accordingly, the NOR gate NOR2 controls the skew adjusting signal ENHS to be activated to a high level under the condition that the calibration codes NC_SB<3> and NC_SB<2> and the input control signal ENDIN are low in level. In this case, the skew adjusting signal ENHSB goes low in level, and the enable signal EN goes high in level.

If the enable signal EN goes high in level, the activation unit 230 is operated as described above. If the skew adjusting signal ENHS goes high in level, the NMOS transistor N11 is turned on. In addition, if the skew adjusting signal ENHSB goes low in level, the PMOS transistors P19 and P20 are turned on.

If the PMOS transistors P19 and P20 are turned on, the drain terminals of the NMOS transistors N8 and N9 (i.e., both nodes of the comparator 200) are precharged by the power-supply voltage VDDQ. In other words, a current is provided to the input buffer circuit through the precharge units 210 and 220, and at the same time a path to ground is simultaneously achieved by the skew adjusting unit 240, resulting in a reduction in a variation in skew of the input buffer circuit.

Accordingly, if the skew indicating the switching speed of the transistor is in the slow (SS) state, each of the activation unit 230, the precharge units 210 and 220, and the skew adjusting unit 240 is operated so that the operating current is increased.

On the other hand, the NOR gate NOR2 deactivates the skew adjusting signal ENHS to a low level when any one of the input signal ENDIN and the calibration codes NC_SB<3> and NC_SB<2> is high in level. In this case, the skew adjusting unit 240 is turned off so that the precharge units 210 and 220 do not perform the skew adjusting operation.

Figure 4:
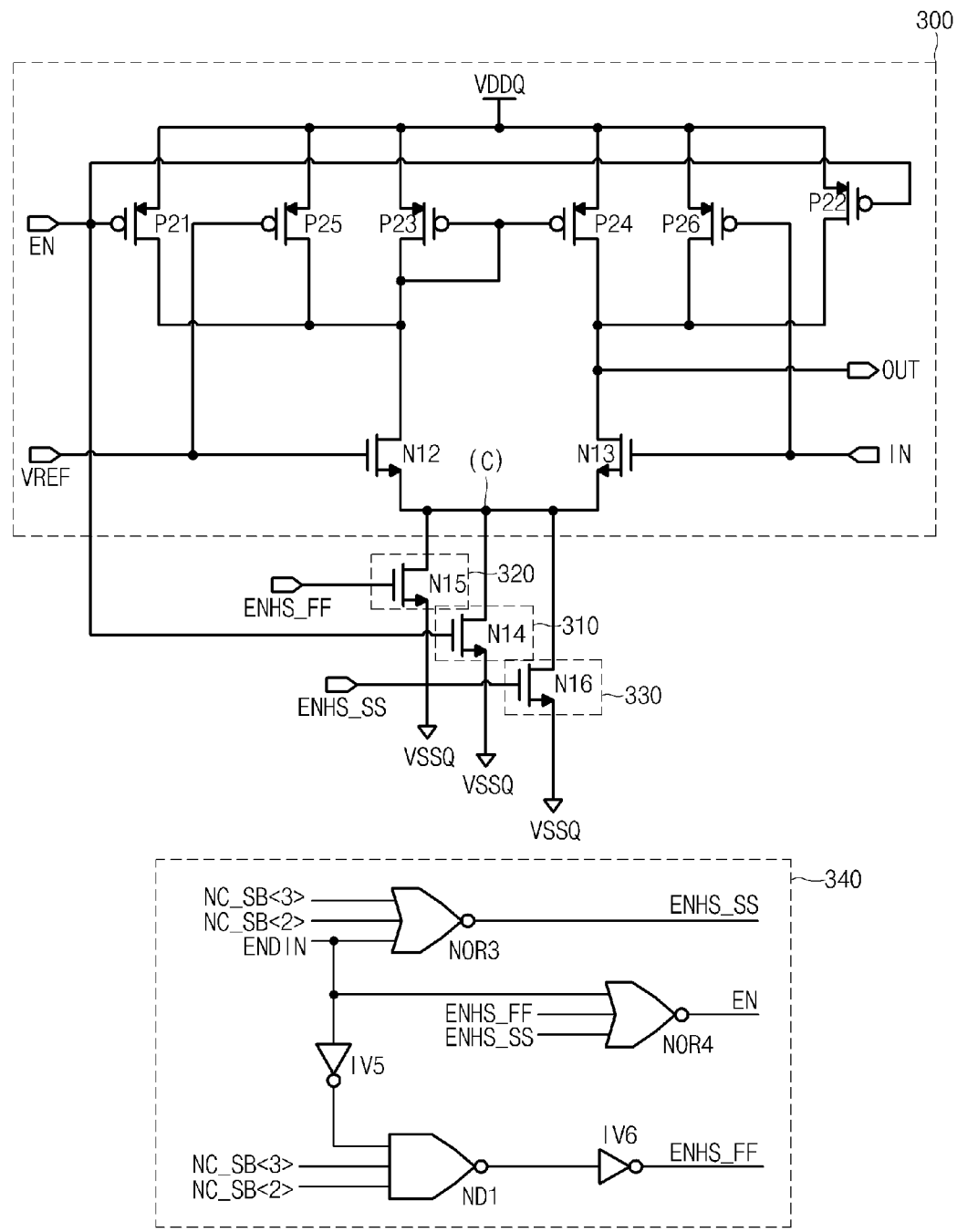
FIG. 4 is a circuit diagram illustrating an input buffer circuit according to still another embodiment of the present invention.

FIG. 4 is a circuit diagram illustrating an input buffer circuit according to still another embodiment of the present invention.

Referring to FIG. 4, the input buffer circuit includes a comparator 300, an activation unit 310, skew adjusting units 320 and 330, and a control signal generator 340.

In this case, the comparator 300 compares a reference voltage (VREF) level with an input signal (IN) level, and outputs an output signal OUT according to the result of comparison. In response to a difference in the input signal (IN) level and the reference voltage (VREF) level, a voltage level of the output signal OUT of the comparator 300 is changed.

The comparator 300 is a current-mirror-type unit amplifier, and includes a plurality of PMOS transistors P21 to P26 and a plurality of NMOS transistors N12 and N13.

Each of the PMOS transistors P21 and P22 is used as a precharge transistor controlled by an enable signal EN. The PMOS transistors P21 and P22 are coupled in parallel to PMOS transistors P25 and P26, respectively, and they receive the enable signal EN through a common gate terminal.

The PMOS transistors P25 and P26 are coupled in parallel to the PMOS transistors P23 and P24, respectively, and they receive the reference voltage VREF and the input signal IN through their gate terminals, respectively. In addition, the PMOS transistors P23 and P24 are coupled between a power-supply voltage (VDDQ) input terminal and each NMOS transistor N12 or N13, respectively. The gate terminals of the PMOS transistors P23 and P24 and a drain terminal of the PMOS transistor P23 are also commonly coupled.

The NMOS transistor N12 is coupled between the drain terminal of the PMOS transistor P23 and a node C, so that it receives the reference voltage VREF through a gate terminal. In this case, the reference voltage VREF has a voltage level that is half of a power-supply voltage VDDQ. The NMOS transistor N13 is coupled between a drain terminal of the PMOS transistor P24 and the node C, so that it receives the input signal IN through a gate terminal.

The activation unit 310 includes an NMOS transistor N14 that is coupled between the node C and a ground voltage terminal VSSQ so as to receive the enable signal EN through a gate terminal.

The skew adjusting unit 320 includes an NMOS transistor N15 that is coupled between the node C and the ground voltage terminal VSSQ so as to receive a skew adjusting signal ENHS_FF through a gate terminal. The skew adjusting unit 330 includes an NMOS transistor N16 that is coupled between the node C and the ground voltage terminal VSSQ so as to receive a skew adjusting signal ENHS_SS through a gate terminal.

In this case, the NMOS transistor N15 among several transistors of the skew adjusting units 320 and 330 and the activation unit 310 has the smallest size. The NMOS transistor N14 is larger in size than the NMOS transistor N15. In addition, the NMOS transistor N16 is larger in size than the NMOS transistor N14.

That is, typically, only the activation unit 310 is operated. In the case of adjusting the skew in such a manner that a high current flow is needed in the input buffer circuit, the skew adjusting unit 330 having the largest transistor is operated. In the case of adjusting the skew in such a manner that a low current flow is needed in the input buffer circuit, the skew adjusting unit 320 having the smallest transistor is operated.

The control signal generator 340 includes NOR gates NOR3 and NOR4, inverters IV5 and IV6, and a NAND gate ND1.

In this case, the NOR gate NOR3 performs a NOR operation between an input control signal ENDIN and each of the calibration codes NC_SB<3> and NC_SB<2>, and thus outputs a skew adjusting signal ENHS_SS. The NOR gate NOR4 performs a NOR operation between each skew adjusting signal ENHS_SS or ENHS_FF and the input control signal ENDIN, and thus outputs the enable signal EN.

The NAND gate ND1 performs a NAND operation between an inverted signal of the input control signal ENDIN output from the inverter IV5 and each of the calibration codes NC_SB<3> and NC_SB<2>. The inverter IV6 inverts an output signal of the NAND gate ND1, so that it outputs the skew adjusting signal ENHS_FF.

The operations of the input buffer circuit according to this embodiment of the present invention will hereinafter be described with reference to FIG. 4.

First, if the enable signal EN is low in level, the NMOS transistor N14 is turned off, the PMOS transistors P21 and P22 are turned on, so that the output signal OUT is fixed to a high level irrespective of the input signal (IN) level.

The above-mentioned enable signal EN is a signal for controlling the input buffer circuit. If the enable signal EN is low in level, the input buffer circuit is not operated so that it outputs a high-level signal. If the enable signal EN is high in level, the input buffer circuit is operated. Accordingly, if the enable signal EN is high in level, the NMOS transistor N14 is turned on, and the PMOS transistors P21 and P22 are turned off.

In this case, if the input signal IN is equal to or higher than the reference voltage VREF, the output signal OUT is output as a low-level signal. If the input signal IN is lower than the reference voltage VREF, the output signal OUT is output as a high-level signal.

As a result, the input buffer circuit according to this embodiment of the present invention can change a level of the input signal IN to a discrete signal with a power-supply voltage VDDQ or a ground voltage VSSQ.

The control signal generator 340 may use the calibration codes NC_SB<3> and NC_SB<2> shown in Table 1 so as to adjust the skews of the skew adjusting units 320 and 330.

If a decimal value is in the range of 0~6 on the basis of a specific decimal reference value (i.e., '7'), the skew indicating the switching speed of the transistor is controlled to be in a slow (SS) state. A signal for controlling the skew adjusting unit 330 under the condition that the skew is in the slow (SS) state is determined to be the skew adjusting signal ENHS_SS. It is assumed that the decimal value '7' indicates that the skew indicating the switching speed of the transistor belongs to a typical case.

In contrast, if a decimal value is in the range of 8~15 on the basis of a decimal reference value (i.e., '7'), the skew indicating the switching speed of the transistor is controlled to be in a fast (FF) state. A signal for controlling the skew adjusting unit 320 under the condition that the skew is in the fast (FF) state is determined to be the skew adjusting signal ENHS_FF.

If the skew of the transistor is in the slow (SS) state, the operating current is increased so that the skew of the transistor is similar to those of the typical case. In contrast, if the skew of the transistor is in the fast (FF) state, the operating current is decreased so that the skew of the transistor is similar to those of the typical case.

Therefore, the control signal generator 340 controls the skew adjusting signals ENHS_FF and ENHS_SS for controlling the skew adjusting units 320 and 330 in response to the ZQ calibration codes shown in Table 1, and controls an activation state of the enable signal EN that controls the activation unit 310.

In this case, the calibration codes NC_SB<3> and NC_SB<2> may control the skew adjusting signal ENHS, and the input control signal ENDIN may control the enable signal EN.

Therefore, if each of the calibration codes NC_SB<3> and NC_SB<2> and the input control signal ENDIN is low in level, the NOR gate NOR3 controls the skew adjusting signal ENHS_SS to be activated to a high level and also controls the enable signal EN to be low in level.

If the enable signal EN goes low in level, the activation unit 310 is turned off as described above. When the skew adjusting signal ENHS_SS goes high in level, the NMOS transistor N16 is turned on.

If the skew indicating the switching speed of the transistor is in the slow (SS) state, the activation unit 310 is turned off and the skew adjusting unit 330 is operated, so that the operating current is increased relative to using the activation unit 310. In this case, if the calibration codes NC_SB<3> and NC_SB<2> are low in level, the skew adjusting signal ENHS_FF goes low in level in response to the operations of the NAND gate ND1 and the inverter IV6. Therefore, the skew adjusting unit 320 is turned off.

If the calibration codes NC_SB<3> and NC_SB<2> are low in level, these low-level calibration codes NC_SB<3> and NC_SB<2> indicate that the strength of an output signal of the output buffer that uses the ZQ calibration code is greater than a reference value (i.e., decimal value=7).

In this case, further increasing of a current into the input buffer is required so that turn-on resistance of the transistor can be matched. That is, the transistor skew of the output buffer is in the slow (SS) state.

On the other hand, the NOR gate NOR3 deactivates the skew adjusting signal ENHS_SS to a low level when any one of the input signal ENDIN and the calibration codes NC_SB<3> and NC_SB<2> is high in level. In this case, the skew adjusting unit 330 is turned off so that the skew adjusting operation is not achieved.

Meanwhile, if both the calibration codes NC_SB<3> and NC_SB<2> from among the input control signal ENDIN and the calibration codes NC_SB<3> and NC_SB<2> are high in level, the skew adjusting signal ENHS_SS is deactivated to a low level and the enable signal EN goes low in level.

If the enable signal EN goes low in level, the activation unit 310 is turned off as described above. In addition, the skew adjusting signal ENHS_FF goes high in level in response to the operations of the NAND gate ND1 and the inverter IV6, so that the NMOS transistor N15 is turned on.

If the skew indicating the switching speed of the transistor is in the fast (FF) state, the activation unit 310 is turned off and the skew adjusting unit 320 is operated, so that the operating current is decreased relative to using the activation unit 310. In this case, if the calibration codes NC_SB<3> and NC_SB<2> are high in level, the skew adjusting signal ENHS_SS goes low in level in response to the output signal of the NOR gate NOR3. Therefore, the skew adjusting unit 330 is turned off.

If the calibration codes NC_SB<3> and NC_SB<2> are high in level, these high-level calibration codes NC_SB<3> and NC_SB<2> indicate that the strength of an output signal of the output buffer that uses the ZQ calibration code is smaller than a reference value (i.e., decimal value=7).

In this case, further increasing of a current into the input buffer is required so that turn-on resistance of the transistor can be matched. That is, the transistor skew of the output buffer is in the fast (FF) state.

On the other hand, in the case where each of the input control signal ENDIN and the calibration code NC_SB<3> are low in level and the calibration code NC_SB<2> is high in level, and the skew adjusting signals ENHS_SS and ENHS_FF are deactivated to a low level, the enable signal EN goes high in level. In this case, under the typical state, the skew adjusting units 320 and 330 are turned off and only the activation unit 310 is operated.

As apparent from the above description, the embodiments of the present invention have the following effects.

First, an embodiment of the present invention relates to an input buffer circuit that compensates for variation in operation characteristics in response to a variation in skew by controlling an operation current of an input buffer using a ZQ calibration code, thereby performing a stable operation.

Second, an embodiment of the present invention relates to an input buffer circuit that properly copes with a variation in skew of an input buffer using a ZQ calibration code configured to control the strength of an output signal of an output buffer that uses the same power source and transistor as those of the input buffer.

Those skilled in the art will appreciate that the present invention may be carried out in other specific ways than those set forth herein without departing from the spirit and essential characteristics of the present invention. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. An input buffer circuit comprising:
   a comparator configured to compare a reference voltage with a voltage of an input signal, and output an output signal;
   an activation unit configured to activate or deactivate the input buffer circuit in response to an enable signal;
   a skew adjusting unit configured to change an amount of a current flowing in the comparator in response to one or more skew adjusting signals; and
   a control signal generator configured to generate the enable signal and the one or more skew adjusting signals in response to one or more calibration codes and an input control signal,
   wherein, if the calibration codes are in a slow (SS) state, both the activation unit and the skew adjusting unit are operated so that the amount of the current flowing in the comparator is increased.

2. The input buffer circuit according to claim 1, wherein the skew adjusting unit includes a first transistor to provide a pull-down voltage to the comparator in response to a first skew adjusting signal from among the skew adjusting signals.

3. The input buffer circuit according to claim 2, wherein:
   if the calibration codes are in the slow (SS) state, each of the calibration codes goes to a low state, so that the first skew adjusting signal is activated to a high level and the enable signal is output as a high-level signal.

4. The input buffer circuit according to claim 2, further comprising:
   a precharge unit configured to provide a precharge voltage to the comparator in response to a second skew adjusting signal that has a phase opposite to that of the first skew adjusting signal.

5. The input buffer circuit according to claim 4, wherein the control signal generator activates the second skew adjusting signal to a low level when each of the calibration codes and the input control signal is in a low state.

6. The input buffer circuit according to claim 1, wherein the skew adjusting unit includes:
   a first skew adjusting unit configured to provide a pull-down voltage to the comparator in response to a third skew adjusting signal from among the skew adjusting signals; and
   a second skew adjusting unit configured to provide a pull-down voltage to the comparator in response to a fourth skew adjusting signal form among the skew adjusting signals.

7. The input buffer circuit according to claim 6, wherein the first skew adjusting unit includes a second transistor that is smaller in size than a transistor included in the activation unit.

8. The input buffer circuit according to claim 6, wherein the second skew adjusting unit includes a third transistor that is larger in size than a transistor included in the activation unit.

9. The input buffer circuit according to claim 6, wherein:
   if the calibration codes are in the slow (SS) state, the second skew adjusting unit is operated so that the amount of the current flowing in the comparator is increased.

10. The input buffer circuit according to claim 6, wherein:
if the calibration codes are in a fast (FF) state, the first skew adjusting unit is operated so that the amount of the current flowing in the comparator is reduced.

11. The input buffer circuit according to claim 6, wherein the control signal generator activates the fourth skew adjusting signal to a high level when the calibration codes and the input control signal are in a low state.

12. The input buffer circuit according to claim 6, wherein the control signal generator activates the third skew adjusting signal to a high level when the calibration codes and the input control signal are high in level.

13. The input buffer circuit according to claim 6, wherein the control signal generator activates the enable signal to a high level when the calibration codes and the input control signal are a low state.

14. The input buffer circuit according to claim 1, wherein the one or more calibration codes and the input control signal are provided from outside the input buffer circuit.

* * * * *